United States Patent [19]

Cotton

[11] Patent Number: 5,077,799
[45] Date of Patent: Dec. 31, 1991

[54] AUTOMATIC VOLUME CONTROL CIRCUIT

[76] Inventor: Brian Cotton, R.R. 3, Box 251, Manchester, Iowa 52057

[21] Appl. No.: 573,892

[22] Filed: Aug. 27, 1990

Related U.S. Application Data

[63] Continuation of Ser. No. 297,979, Jan. 13, 1989, abandoned.

[51] Int. Cl.$^5$ .............................................. H03G 3/20
[52] U.S. Cl. ...................................... 381/57; 387/107
[58] Field of Search ................................. 381/57, 107

[56] References Cited

U.S. PATENT DOCUMENTS

| | | |
|---|---|---|
| 2,338,551 | 1/1944 | Stanko . |
| 2,392,218 | 1/1946 | Anderson . |
| 3,160,707 | 12/1964 | Meyers . |
| 3,296,373 | 1/1967 | Suganuma . |
| 3,409,738 | 11/1968 | Heald et al. . |
| 3,410,958 | 11/1968 | Cohen . |
| 4,101,843 | 7/1978 | Aoyama . |
| 4,254,303 | 3/1981 | Takizawa . |
| 4,521,738 | 6/1985 | Akagiri et al. . |
| 4,627,098 | 12/1986 | Dolikian et al. . |
| 4,691,307 | 9/1987 | Rambow . |
| 4,771,472 | 9/1988 | William, III et al. . |

Primary Examiner—Forester W. Isen
Attorney, Agent, or Firm—MacMillan, Sobanski & Todd

[57] ABSTRACT

An electronic circuit for automatically adjusting the volume of an audio program in accordance with changes in the magnitude of ambient noise is disclosed. A voltage signal is generated which is proportional to the magnitude of the ambient noise. The voltage signal is applied to the cathode of a diode. The anode of the diode is connected through a capacitor to ground potential. The anode of the diode is also connected to a variable resistance device, which controls the volume of the audio program in accordance with the voltage across the capacitor. When the magnitude of the ambient noise increases, the capacitor is slowly charged by the leakage current passing through the reversed biased diode. As a result, the volume of the audio program is slowly increased. When the magnitude of such noise decreases, the capacitor is rapidly discharged through the forward biased diode. Thus, the volume of the audio program is rapidly decreased.

3 Claims, 1 Drawing Sheet

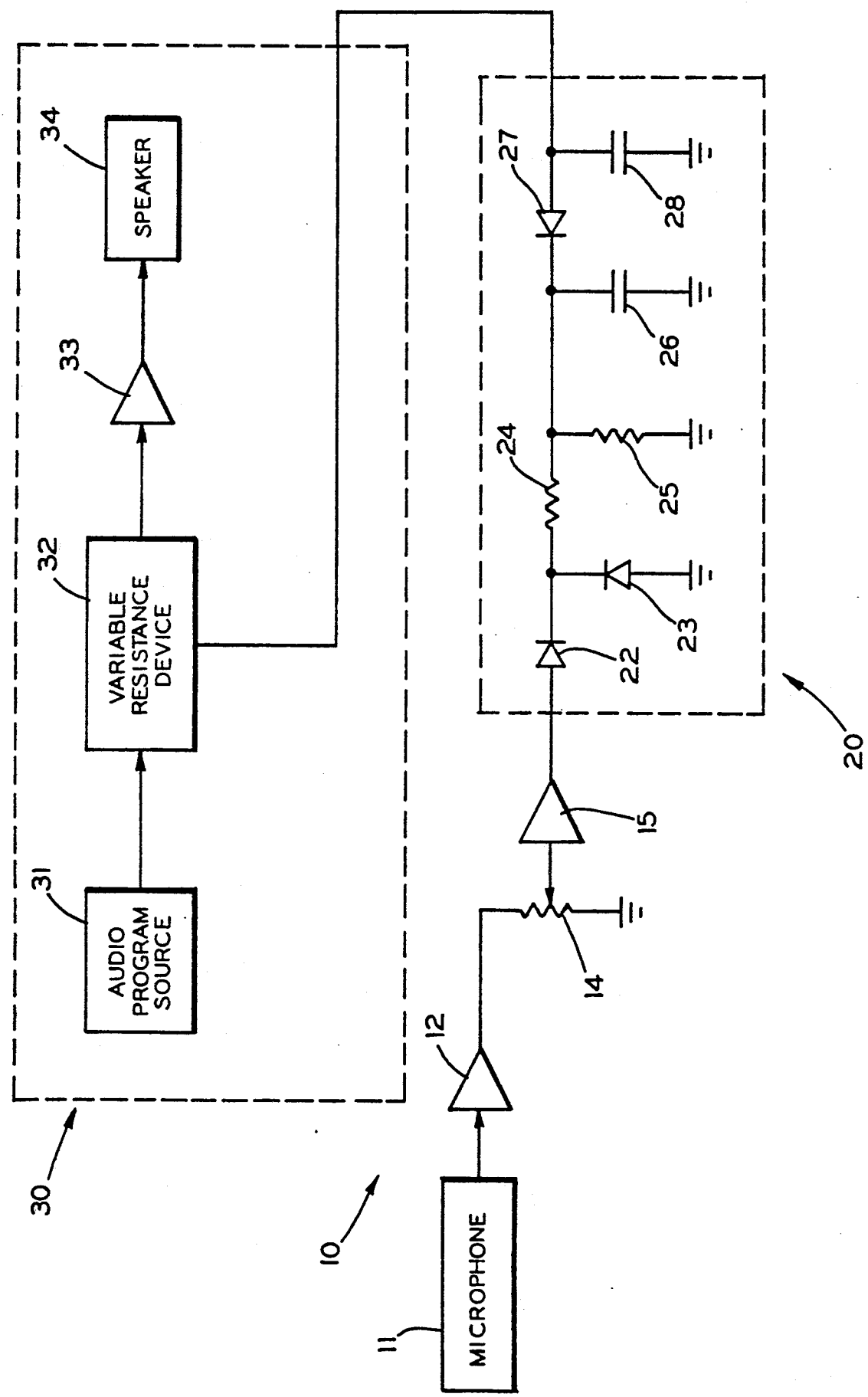

AUTOMATIC VOLUME CONTROL CIRCUIT

CROSS REFERENCE TO RELATED APPLICATION

This application is a continuation of application Ser. No. 07/297,979, filed Jan. 13, 1989, now abandoned.

BACKGROUND OF THE INVENTION

This invention relates in general to noise responsive devices and in particular to an electronic circuit for automatically adjusting the volume of an audio program in response to the level of ambient noise.

Oftentimes, an audio program, such as the audio output of a radio, tape recorder, television, and the like, is heard by a listener in an environment which includes a certain amount of ambient or background noise. The amount of such ambient noise is rarely constant, but rather varies considerably in relation to the relatively constant volume of the audio program. Many devices are known in the art for automatically adjusting the volume of an audio program to compensate for variations in the level of the ambient noise. Typically, these devices sense the magnitude of the ambient noise, using a microphone or similar means, and automatically increase or decrease the volume of the audio program in accordance with changes in such magnitude. Unfortunately, known automatic volume control devices are typically complicated in structure and, as a result, rather expensive. Thus, it would be desirable to provide an automatic volume control circuit for an audio program which is simple and inexpensive in construction and operation.

SUMMARY OF THE INVENTION

This invention relates to a simple and inexpensive electronic circuit for automatically adjusting the volume of an audio program in accordance with changes in the magnitude of ambient noise. A voltage signal is generated which is proportional to the magnitude of the ambient noise. The voltage signal is applied to the cathode of a diode. The anode of the diode is connected through a capacitor to ground potential. The anode of the diode is also connected to a variable resistance device, which controls the volume of the audio program in accordance with the voltage across the capacitor. When the magnitude of the ambient noise increases, the capacitor is slowly charged by the leakage current passing through the reversed biased diode. As a result, the volume of the audio program is slowly increased. When the magnitude of such noise decreases, the capacitor is rapidly discharged through the forward biased diode. Thus, the volume of the audio program is rapidly decreased. The rate at which the volume of the audio program is lowered in response to a decrease in the magnitude of the ambient noise is much faster than the rate at which the volume is raised in response to an increase in the magnitude of such noise.

It is an object of this invention to provide an improved electronic circuit for automatically adjusting the volume of an audio program in response to the level of ambient noise.

It is another object of this invention to provide such an electronic circuit which slowly increases the volume of the audio program as the magnitude of the ambient noise increases, but which rapidly decreases the volume of the audio program as the magnitude of the ambient noise decreases.

It is a further object of this invention to provide such an electronic circuit which is simple and inexpensive in construction and operation.

Other objects and advantages of this invention will become apparent to those skilled in the art from the following detailed description of the preferred embodiment, when read in light of the accompanying drawing.

BRIEF DESCRIPTION OF THE DRAWING

The sole Figure is a schematic diagram illustrating an automatic volume control system in accordance with this invention, together with the components of an audio program device.

DETAILED DESCRIPTION OF THE PREFERRED EMBODIMENT

Referring now to the drawing, there is illustrated an automatic volume control system, indicated generally at 10, in accordance with this invention. The system 10 includes a conventional microphone 11 which, as is well known, generates an analog electrical signal which is proportional to the magnitude of the ambient noise. For reasons which will be explained below, the microphone 11 is preferably an ultrasonic microphone, which detects only those sounds which are at frequencies above the normal hearing range. The microphone 11 is located in an environment which includes a varying amount of ambient noise. For example, the microphone 11 may be located in the interior of an automobile or similar vehicle.

The output signal from the microphone 11 is fed through a first amplifier 12, and a variable resistor 14 to a second amplifier 15. The first amplifier 11 increases the magnitude of the signal from the microphone 11. The variable resistor 14 provides a means for adjusting the sensitivity of the system 10. The second amplifier 15 further increases the magnitude of the signal.

The output from the second amplifier 15 is fed to a control circuit, indicated generally at 20. The control of circuit 20 is an input to the anode of a diode 22. The cathode of the diode 22 is connected to the junction of the anode of a diode 23 and a resistor 24. The cathode of the diode 23 is connected to ground potential. The diode 22 and the diode 23 function to double and rectify the voltage of the signal from the second amplifier 15. The resistor 24 is connected to the junction of a resistor 25, a capacitor 26, and the cathode of a diode 27. The resistor 25 and the capacitor 26 are connected to ground potential and, together with the resistor 24, function as a filter for the rectified signal from the diode 22. Thus, the electrical signal present at the junction of the resistor 25, the capacitor 26, and the cathode of the diode 27 is a positive voltage having a magnitude which is proportional to the magnitude of the ambient noise sensed by the microphone 11.

The anode of the diode 27 is connected though a capacitor 28 to ground potential. The anode of the diode 27 is also connected to an audio program system, indicated generally at 30. The audio program system 30 includes a audio program source 31, a variable resistance device 32, an amplifier 33, and a speaker 34. The variable resistance device 32 is conventional in the art and is characterized by exhibiting an electrical resistance which varies directly in response to a control voltage applied thereto. As such control voltage increases, the resistance of the device 32 increases, and vice versa. The variable resistance device 32 may be formed by a VCR3P FET made by the Intersil Company in combination with fixed resistors.

The anode of the diode 27 is connected to the control voltage input of the variable resistance device 32. Thus, the amount of resistance of the variable resistance device 32 is controlled in accordance with the magnitude of the voltage across the capacitor 28. In a known manner, the amount of resistance of the variable resistance device 32 controls the gain of the amplifier 33. When the voltage across the capacitor 28 is increased, the gain of the amplifier 33 (and, thus, the volume of the audio program emitted from the speaker 34) is also increased. Similarly, as the voltage across the capacitor 28 is decreased, the resistance of the variable resistance device 32 decreases, thus decreasing the gain of the amplifier 33 and the volume of the audio program emitted from the speaker 34.

The operation of the control circuit will now be described. High frequency noise components, above the range of normal hearing, are detected by the ultrasonic microphone 10. Thus, the microphone 11 does not sense the relatively low frequency components of the audio program which is being emitted by the speakers 34. The signal from the microphone 11 is conditioned through the various components described above such that, as mentioned above, the signal present at the cathode of the diode 27 is a positive voltage which is proportional in magnitude to the noise sensed by the microphone 11. Assuming that the capacitor 28 is initially discharged, the positive voltage present at the cathode of the diode 27 causes the capacitor 28 to slowly become charged. Such charging occurs because the diode 27 leaks a relatively small amount of electrical current therethrough, even though it is reversed biased in this initial condition. This leakage current slowly charges the capacitor 28 such that the voltage at the anode of the diode 27 and the capacitor 28 becomes increasing positive. Thus, as described above, the variable voltage device 32 causes the volume of the audio program to slowly increase.

However, if the voltage at the cathode of the diode 27 decreases below the voltage at the anode of the diode 27 (resulting from a decrease in the magnitude of the sensed noise), the capacitor 28 will discharge through the diode 27 and the resistor 25 to ground potential. In this situation, the diode 27 is forward biased. Therefore, the capacitor 28 is very rapidly discharged through the diode 27. Consequently, as described above, the variable voltage device 32 causes the volume of the audio program to rapidly decrease.

When the magnitude of the noise sensed by the microphone 11 is constant, the capacitor 28 will be charged to a certain constant value, thus controlling the volume of the audio program at a desired constant level. If the magnitude of such noise increases, the capacitor 28 will be slowly charged as described above so as to slowly increase the volume of the audio program. On the other hand, if the magnitude of such noise decreases, the capacitor 28 will be rapidly discharged as described above so as to rapidly decrease the volume of the audio program. It will be appreciated that since the capacitor 28 is discharged at a rate which is much faster than the rate at which it is charged, the volume of the audio program is lowered more quickly in response to a decrease in the magnitude of the ambient noise sensed by the microphone 11 than it is raised in response to an increase in the magnitude of such noise. This is desirable because it prevents the volume of the audio program from being too loud when the ambient noise decreases suddenly.

Thus, the present invention provides a very simple and inexpensive means of automatically controlling the output volume of an audio device such that it is maintained at a comfortable level in relation to the volume of the ambient noise. Because only the high frequency components of the background noise are sensed, and since the audio program itself is typically composed of lower frequency signals, undesirable feedback is avoided. If an overlap of the high frequencies and the audio frequencies should occur for a particular application, conventional filtering may be added to solve the problem.

In accordance with the provisions of the patent statutes, the principle and mode of operation of this invention have been explained and illustrated in its preferred embodiment. However, it must be understood that this invention may be practiced otherwise than as specifically explained and illustrated without departing from its spirit or scope.

What is claimed is:

1. An electronic circuit for automatically adjusting the volume of an audio program in accordance with changes in the magnitude of ambient noise comprising:
    means responsive to the ambient noise for generating a voltage representative thereof having only a first polarity;
    a capacitor;
    a diode having a cathode and an anode, said diode connecting said voltage generating means and said capacitor so as to be reverse biased with respect to said first polarity; and
    means connected to said capacitor for automatically adjusting the volume of the audio program in accordance with the voltage across said capacitor, whereby said capacitor is slowly charged by the leakage current through said diode as the magnitude of ambient noise increases so as to slowly increase the volume of the audio program.

2. The invention defined in claim 1 wherein said capacitor is also connected to ground potential.

3. The invention defined in claim 1 wherein said cathode of said diode is connected through a resistor to ground potential, whereby said capacitor is rapidly discharged through said diode and said resistor as the magnitude of ambient noise decreases so as to rapidly decrease the volume of the audio program.

* * * * *